US011572622B2

(12) United States Patent
Xie et al.

(10) Patent No.: US 11,572,622 B2
(45) Date of Patent: Feb. 7, 2023

(54) SYSTEMS AND METHODS FOR CLEANING LOW-K DEPOSITION CHAMBERS

(71) Applicant: Applied Materials, Inc., Santa Clara, CA (US)

(72) Inventors: Bo Xie, San Jose, CA (US); Ruitong Xiong, Santa Clara, CA (US); Kang Sub Yim, Palo Alto, CA (US); Yijun Liu, Santa Clara, CA (US); Li-Qun Xia, Cupertino, CA (US); Sure K. Ngo, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 158 days.

(21) Appl. No.: 17/020,256

(22) Filed: Sep. 14, 2020

(65) Prior Publication Data
US 2022/0081765 A1     Mar. 17, 2022

(51) Int. Cl.
*H01L 21/02* (2006.01)
*C23C 16/40* (2006.01)
(Continued)

(52) U.S. Cl.
CPC ........ *C23C 16/4405* (2013.01); *B08B 7/0035* (2013.01); *C23C 16/325* (2013.01);
(Continued)

(58) Field of Classification Search
None
See application file for complete search history.

(56) References Cited

U.S. PATENT DOCUMENTS

| 6,503,843 B1 | 1/2003 | Xia et al. |
| 2006/0027249 A1* | 2/2006 | Johnson ............ C23C 16/4405 134/1.1 |

(Continued)

FOREIGN PATENT DOCUMENTS

| EP | 1840946 A1 | 10/2007 | |
| KR | 10-2050496 | * 2/2013 | ............ H01L 21/02 |
| KR | 10-2050496 B1 | 12/2019 | |

OTHER PUBLICATIONS

International Search Report and Written Opinion dated Dec. 29, 2021 in International Patent Application No. PCT/US2021/049316, 10 pages.

*Primary Examiner* — Asok K Sarkar
(74) *Attorney, Agent, or Firm* — Kilpatrick Townsend & Stockton LLP

(57) ABSTRACT

Exemplary semiconductor processing methods to clean a substrate processing chamber are described. The methods may include depositing a dielectric film on a first substrate in a substrate processing chamber, where the dielectric film may include a silicon-carbon-oxide. The first substrate having the dielectric film may be removed from the substrate processing chamber, and the dielectric film may be deposited on at least one more substrate in the substrate processing chamber. The at least one more substrate may be removed from the substrate processing chamber after the dielectric film is deposited on the substrate. Etch plasma effluents may flow into the substrate processing chamber after the removal of a last substrate having the dielectric film. The etch plasma effluents may include greater than or about 500 sccm of $NF_3$ plasma effluents, and greater than or about 1000 sccm of $O_2$ plasma effluents.

20 Claims, 3 Drawing Sheets

(51) Int. Cl.
*C23C 16/44* (2006.01)
*C23C 16/32* (2006.01)
*C23C 16/50* (2006.01)
*H01J 37/32* (2006.01)
*B08B 7/00* (2006.01)

(52) U.S. Cl.
CPC ............ *C23C 16/401* (2013.01); *C23C 16/50* (2013.01); *H01J 37/32724* (2013.01); *H01J 37/32862* (2013.01); *H01J 37/32899* (2013.01); *H01L 21/02126* (2013.01); *H01L 21/02274* (2013.01)

(56) References Cited

U.S. PATENT DOCUMENTS

| | | |
|---|---|---|
| 2009/0035918 A1 | 2/2009 | Chen et al. |
| 2013/0330935 A1* | 12/2013 | Varadarajan ........ H01L 29/4983 257/E21.24 |
| 2020/0095677 A1 | 3/2020 | Tsiang et al. |

* cited by examiner

_US 11,572,622 B2_

SYSTEMS AND METHODS FOR CLEANING LOW-K DEPOSITION CHAMBERS

TECHNICAL FIELD

The present technology relates to treatment and cleaning processes for dielectric deposition chambers. More specifically, the present technology relates to methods of treating and cleaning chambers for depositing low-k films that may not utilize UV treatments.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology include semiconductor processing methods to clean surfaces of processing chambers that deposit high-carbon, low-κ, dielectric films on semiconductor substrates. The periodic cleaning of these surfaces prevent excessive buildup of dielectric material that can dislodge from the surfaces and fall onto the substrate. The dislodged particle adders create defects on the substrate that reduce device yield. In modern semiconductor processing methods that make highly complex integrated circuits, as few as one or two particle adders on the substrate can reduce device yield to an unacceptably low level. On the other hand, more frequent and time consuming cleaning operations increase fabrication times and reduce substrate throughput. Thus, the present technology addresses the need for chamber cleaning and treatment operations that reduce the number of particle adders falling on substrates in the chamber while maintaining or increasing the substrate throughput of the chamber during high-carbon, low-κ, dielectric film deposition operations.

Embodiments of the present technology include semiconductor processing methods to remove dielectric materials formed on the surfaces of a substrate processing chamber during depositions of the dielectric materials on substrates in the chamber. Embodiments of the processing methods may include depositing a silicon-carbon-oxide dielectric film on a first substrate in a substrate processing chamber. In some embodiments, the silicon-carbon-oxide dielectric film deposited on the substrates may be characterized by greater than or about 20 wt. % carbon. The substrate having the dielectric film may be removed from the substrate processing chamber, and the deposition operation may be performed on at least one more substrate that is introduced and removed from the substrate processing chamber. Following the removal of the last of the one or more substrates from the substrate processing chamber, etch plasma effluents may flow into the chamber to remove dielectric materials formed on the surfaces of a substrate processing chamber during the substrate depositions. The etch plasma effluents may include greater than or about 500 sccm of $NF_3$ plasma effluents, and greater than or about 1000 sccm of $O_2$ plasma effluents.

In further embodiments, the methods may include a chamber treatment operation performed between the introduction of substrates to the processing chamber. In some embodiments, this chamber treatment operation may include flowing one or more inert gases through the processing chamber after the removal of the first substrate and before introducing the at least one additional substrate to the processing chamber. In additional embodiments, the chamber treatment operation may include introducing a treatment plasma to the processing chamber after the removal of the first substrate and before introducing the at least one additional substrate to the processing chamber. In still additional embodiments, the chamber treatment operation may include introducing a deposition plasma to the processing chamber after the removal of the first substrate and before introducing the at least one additional substrate to the processing chamber. In some embodiments, the deposition plasma forms a silicon oxide film on the surfaces of the processing chamber exposed to the plasma.

In additional embodiments, the etch plasma effluents may be formed from an etch plasma generated in a remote plasma system outside the processing chamber. The etch plasma effluents may remove the dielectric film from surfaces of the processing chamber exposed to the deposition plasma at a removal rate greater than or about 10 Å/second. In further embodiments, the etch plasma effluents may be provided to the processing chamber to remove a buildup of the dielectric film on surfaces of the processing chamber exposed to the deposition plasma by greater than or about 250 Å.

Embodiments of the present technology may also include methods to etch dielectric materials from the surfaces of a semiconductor processing chamber. Embodiments of the methods may include depositing a dielectric film on at least one substrate in a substrate processing chamber, where the dielectric film comprises a silicon-carbon-oxide. Embodiments of the methods may further include introducing a deposition plasma to the processing chamber after removal of the substrate from the processing chamber, where the deposition plasma forms one or more silicon oxide films on surfaces of the processing chamber exposed to the deposition plasma. Embodiments of the methods may still further include etching the dielectric material and the silicon oxide film from the surfaces of the processing chamber at an etch rate greater than or about 10 Å/second.

In additional embodiments, the deposition plasma that forms the one or more silicon oxide films may be generated from a silicon-containing precursor that is also used to deposit the dielectric film on the at least one substrate. In further embodiments, each of the one or more silicon oxide films formed on the surfaces of the processing chamber has a thickness less than or about 100 Å. In still further embodiments, the dielectric film may be deposited on at least two substrates in the semiconductor processing chamber before etching the dielectric material and the silicon oxide film from the surfaces of the substrate processing chamber. In some embodiments, the dielectric material and the silicon oxide film may be etched from the surfaces of the processing chamber by a thickness of greater than or about 250 Å. In additional embodiments, the etching of the dielectric material and the silicon oxide film may comprise flowing etch plasma effluents into the semiconductor processing chamber, where the etch plasma effluents comprise a fluorine-containing effluent and an oxygen-containing effluent, and further where the etch plasma effluents flow into the semiconductor processing chamber at greater than or about 2000 sccm.

Embodiments of the present technology may further include semiconductor processing method that cycle at least two substrates through a substrate processing chamber, where a dielectric film comprising silicon-carbon-oxide is deposited on each of the substrates in the substrate processing chamber. In some embodiments, the silicon-carbon-oxide dielectric film may comprise greater than or about 10 wt. % carbon. The methods may further include flowing etchants into the substrate processing chamber after the removal of a last substrate of the at least two substrates. The etchants may comprise $NF_3$ and $O_2$, and the substrate processing chamber may be characterized by a pressure greater than or about 1 Torr during the flow of the etchants into the substrate processing chamber.

In additional embodiments, the etchants may comprise plasma effluents of $NF_3$ and $O_2$ generated in a remote plasma system, where the $NF_3$ plasma effluents flow into the semiconductor processing chamber at greater than or about 2000 sccm. In further embodiments, the etchants may include a carrier gas comprising at least one of helium or argon. The carrier gas may flow into the semiconductor processing chamber at carrier gas flow rate greater than or about 500 sccm. In still further embodiments, the substrate processing chamber may be characterized by a temperature greater than or about 300° C. during the flow of the etchants into the substrate processing chamber. In some embodiments, the semiconductor processing method may further include a chamber treatment operation performed between the introduction of substrates to the processing chamber. Embodiments of the chamber treatment operations may include treating the semiconductor processing chamber after the removal of each of the at least two substrates from the chamber following the deposition of the dielectric film on the substrate. In embodiments, chamber treatment operations may be selected from:

(i) flowing one or more inert gases through the processing chamber after the removal of each of the at least two substrates from the substrate processing chamber,
(ii) introducing a treatment plasma to the processing chamber after the removal of each of the at least two substrates from the substrate processing chamber, and
(iii) introducing a deposition plasma to the processing chamber after the removal of each of the at least two substrates from the substrate processing chamber, where the deposition plasma may form a silicon oxide film on surfaces of the processing chamber exposed to the deposition plasma.

Such technology may provide numerous benefits over conventional systems and techniques. For example, the increased flow rates for fluorine-containing and oxygen-containing etchants increase the rate at which the high-carbon-containing, silicon-carbon-oxide dielectric material is removed from the surfaces of the processing chamber. The higher removal rates permit shorter times for cleaning operations, which may increase the substrate throughput of the processing chamber. Additionally, the chamber treatment operations that may be performed between the introduction of substrates permit depositions of the silicon-carbon-oxide dielectric on multiple substrates before more particle adders are dropped on the substrate. This permits more substrate depositions to be performed before an etch-cleaning operation, which may also increase the substrate throughput of the processing chamber. Embodiments of the present technology, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
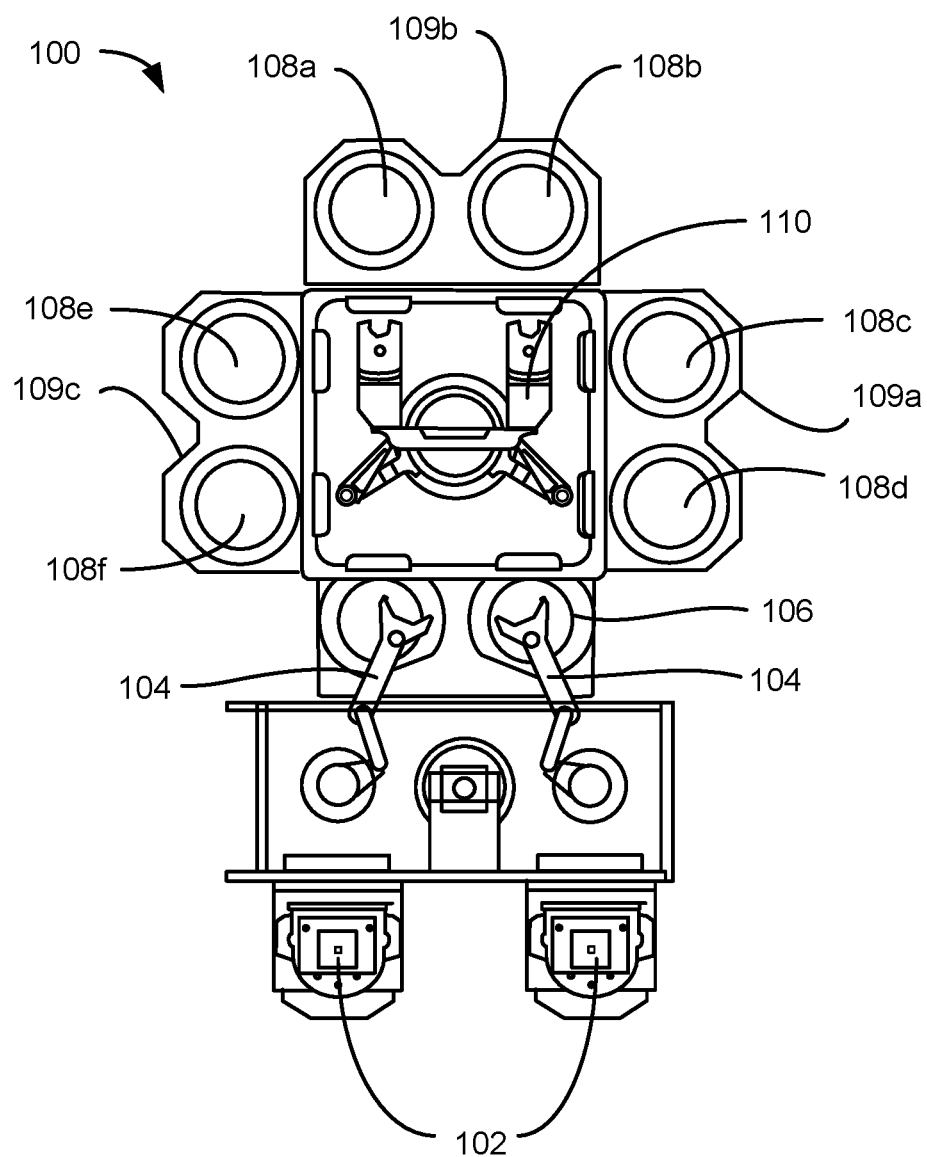
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Embodiments of the present technology include methods to clean the surfaces of processing chambers that have been building up low-κ materials that are difficult to remove using conventional etch-cleaning methods. These low-κ films may be made of carbon-doped silicon oxide deposited as dielectric films in back-end-of-line semiconductor fabrication processes that form the metallization layers of an integrated circuit. These carbon-doped silicon oxide films may have a dielectric constant (κ value) that is less than the dielectric constant of pure silicon oxide (κ=3.9). The lower κ value permits the low-κ film to provide greater electrical isolation between adjacent metal lines than a pure silicon oxide film of the same thickness. The greater electrical isolation may result in several performance enhancements for the integrated circuit, including less parasitic capacitance between adjacent metal lines, and between the metal lines and nearby semiconductor device structures.

Unfortunately, the benefits of a lower dielectric constant (lower κ) for many carbon-doped silicon-oxide films may be offset by a lower hardness and lower stiffness in these films compared to undoped silicon oxide. The lower hardness and stiffness, among other physical characteristics, can make carbon-doped silicon oxide films more prone to damage and defects in subsequent processing operations. One approach to increasing the hardness and stiffness of carbon-doped silicon-oxide films has been to treat the as-deposited film with ultraviolet (UV) light to increase silicon-carbon cross-linking. However, the extra treatment step with UV light, which often must be done by moving the substrate to a separate UV chamber, adds time and complexity to semiconductor fabrication operations.

Another approach to increasing the hardness and stiffness of carbon-doped silicon-oxide films has been to perform thermal and plasma treatments that can be done in the same processing chamber where the film was deposited on the substrate. The elimination of a UV curing operation in a different chamber reduces processing time and increases substrate throughput. However, elimination of a UV curing operation also eliminates a convenient time to clean the surfaces of the deposition chamber in the absence of the substrate that could be damaged by cleaning etchants. In some instances, the thermal and plasma treatments of the carbon-doped silicon-oxide film on the substrate can make the dielectric material formed on the surfaces of the processing chamber more prone to flaking and forming particle adders that can fall on the substrate. Thus, the processing chamber may need frequent cleaning operations to remove the dielectric materials from these surfaces before they drop particle adders on the substrate.

The difficulties with an increased frequency of cleaning operations may be compounded by increased time to conduct a cleaning operation. In many instances, carbon-doped silicon-oxide films that have not been UV cured may be characterized by lower etch rates than UV cured films. In some embodiments, non-UV cured, carbon-doped silicon-oxide materials deposited on exposed surfaces of the processing chamber may have an etch rate less than or about 80% of the etch rate of a UV-cured material produced with the same deposition conditions. The lower etch rates of the non-UV cured materials may be directly correlated with increased etch times for the cleaning operation.

The present technology may overcome these issues by performing a treatment operation between the introduction of substrates to the processing chamber. The treatment operation may condition surfaces of the processing chamber so they drop fewer or no particle adders on a substrate. In some embodiments, the treatment operation may include introducing an inert gas or treatment plasma to the substrate processing chamber to remove loose particle adders from the processing chamber before introducing a substrate. In additional embodiments, the chamber treatment operation may include introducing a deposition plasma to the processing chamber to form a film over the surfaces of the processing chamber that may hold the particle adders in place on the surfaces. In embodiments, these treatment operations may permit depositions of a high-carbon, low-κ, dielectric film on two or more consecutive substrates before performing a cleaning operation. Increasing the number of substrate deposition operations between each cleaning operation from one-to-one (i.e., a 1× clean) to greater than or about two-to-one (i.e., a multiple-× clean) may increase the substrate throughput of the processing chamber by reducing the cumulative cleaning time to process a batch of substrates.

The present technology also addresses the difficulties with high-carbon-containing, low-κ dielectric films being more resistant to cleaning etchants than conventional dielectric films like silicon oxide. Embodiments of the present technology include supplying cleaning etchants to a processing chamber under conditions that increase the etch rate of these high-carbon-containing, low-κ dielectric films from surfaces of the processing chamber. In some embodiments, these conditions may include activating the cleaning etchants in a remote plasma system and flowing the etch plasma effluents into the processing chamber at an increased flow rate compared to conventional etch cleaning operations. In additional embodiments, the conditions may include a decreased pressure of the cleaning etchants in the processing chamber compared to conventional etch cleaning operations. The increased etch rate at which the high-carbon-containing, low-κ dielectric films are removed from the surfaces of the processing chamber permits shorter times to complete a cleaning operation and an increased throughput of substrates through the processing chamber.

Although the remaining disclosure will routinely identify specific deposition and cleaning processes utilizing the disclosed technology, it will be readily understood that the systems and methods are equally applicable to other deposition chambers, as well as processes as may occur in the described chambers. Accordingly, the technology should not be considered to be so limited as for use with the described embodiments of the processes and chambers. The disclosure will discuss one possible system and chamber that may be used to perform deposition and cleaning processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
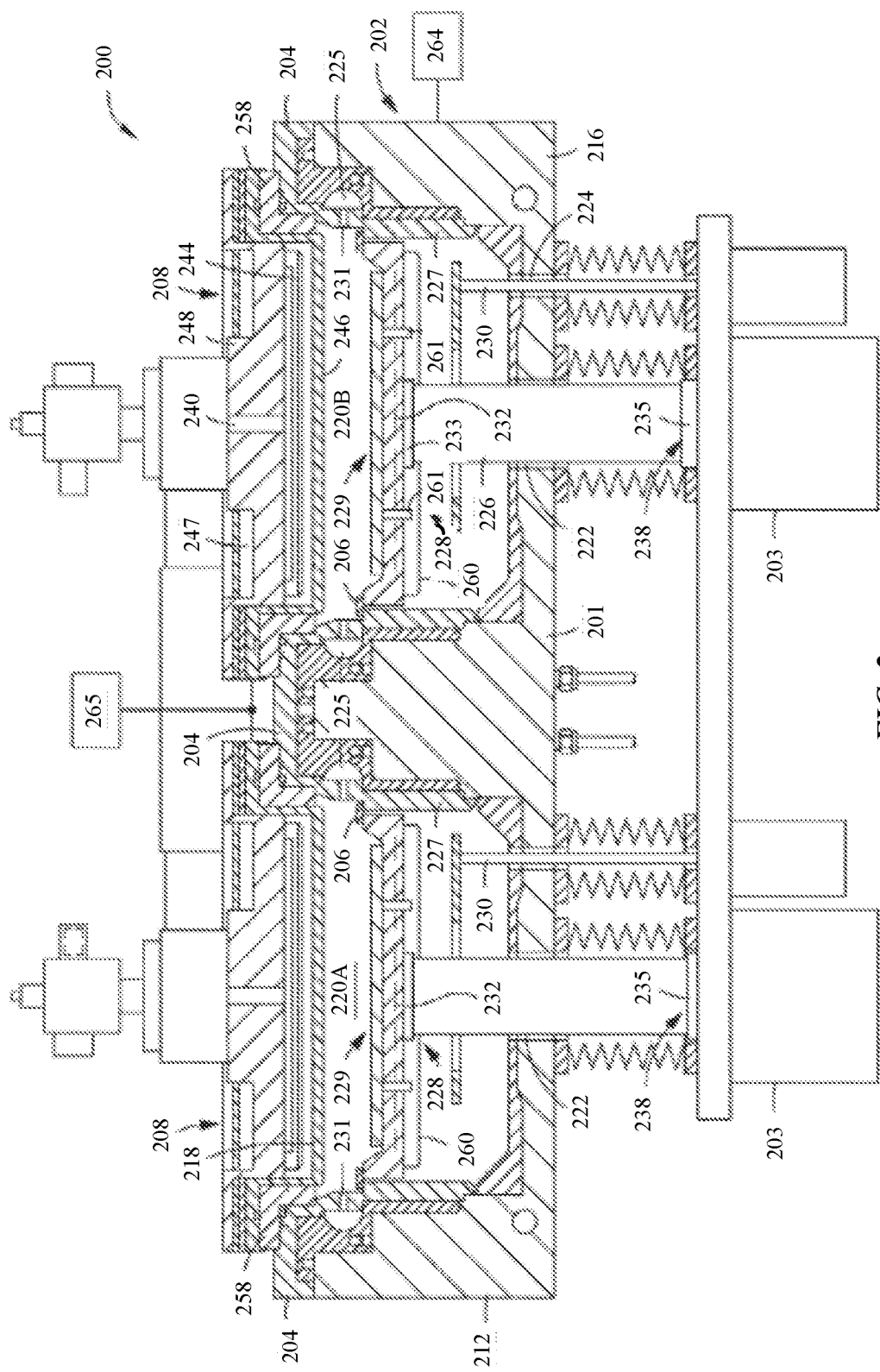
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
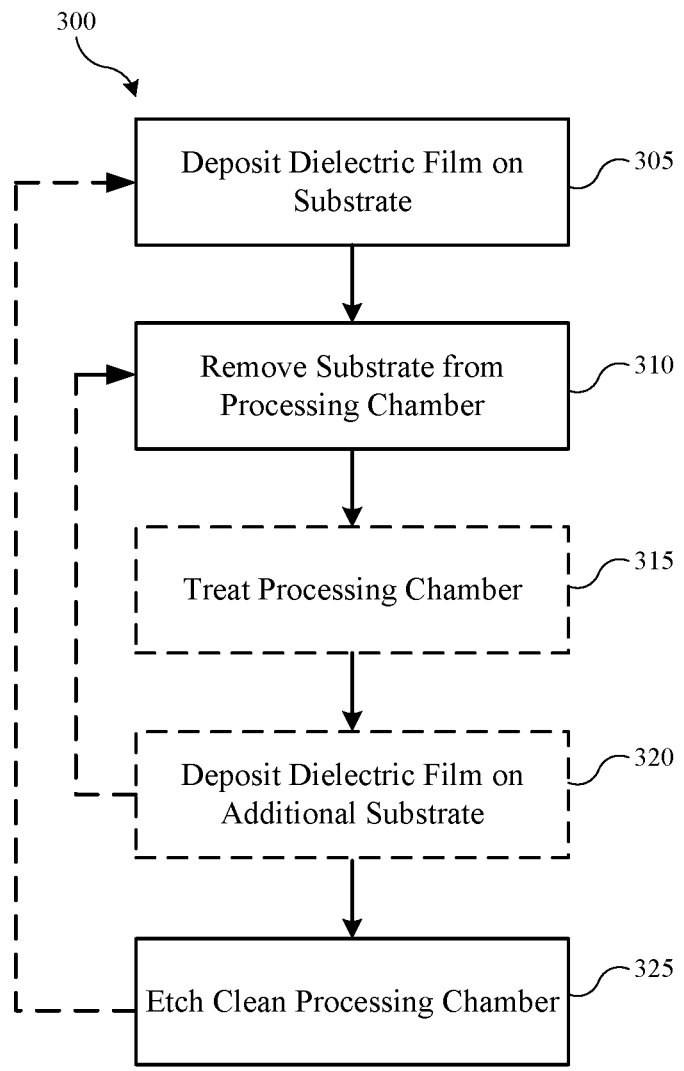
FIG. 3 shows operations of an exemplary method of semiconductor processing according to some embodiments of the present technology.

Embodiments of the present technology may also include processing methods for the removal of dielectric material from the surfaces of a processing chamber that deposits the dielectric material on a substrate. FIG. 3 shows operations of an exemplary method 300 of semiconductor processing according to some embodiments of the present technology. The method may be performed in a variety of processing chambers, including processing system 200 described above, as well as any other chamber in which plasma deposition and cleaning operations may be performed. Method 300 may include a number of optional operations, which may or may not be specifically associated with some embodiments of methods according to the present technology.

Method 300 may include processing operations to remove high-carbon, low-κ, dielectric materials from the surfaces of a processing chamber following the deposition of the dielectric materials on one or more consecutive substrates passing through the chamber. In embodiments, the processing operations of method 300 may include depositing a dielectric film on a first substrate in the substrate processing chamber 305. In some embodiments, the dielectric film may be a high-carbon, low-κ, silicon-carbon-oxide film. In additional embodiments, the silicon-carbon-oxide film may be characterized by a carbon content that is greater than or about 10 at. %, greater than or about 12.5 at. %, greater than or about 15 at. %, greater than or about 17.5 at. %, greater than or about 20 at. %, greater than or about 22.5 at. %, greater than or about 25 at. %, greater than or about 27.5 at. %, greater than or about 30 wt. %, or more. In contrast, a conventional, low-κ, silicon-carbon-oxide film may be characterized by a carbon content that is less than 20 at. %, less than or about 19 at. %, less than or about 18 at. %, less than or about 17 at. %, less than or about 16 wt. %, less than or about 15 at. %, or less.

In embodiments, the depositing of the dielectric film on a first substrate in the substrate processing chamber 305 may include a plasma enhanced deposition of a high-carbon, low-κ, silicon-carbon-oxide film on the substrate. The plasma enhanced deposition may include the generation of a deposition plasma from deposition precursors that include a silicon-and-carbon-containing precursor. In some embodiments the silicon-and-carbon-containing precursor may further include oxygen, while in additional embodiments the deposition precursors may further include a separate oxygen-containing precursor such as molecular oxygen ($O_2$). In embodiments, the deposition precursors may include one or more silicon-carbon-and-oxygen-containing precursors such as dimethyldimethoxysilane, trimethylmethoxysilane, methyltrimethoxysilane, diethoxymethylsilane, octamethoxycyclotetrasiloxane, vinylmethyldimethoxysilane, 1,3-dimethyl-1,1,3,3-tetramethoxydisiloxane, isobutylmethyldimethoxysilane, tetramethyl-1,3-dimethoxydisiloxane, isobutyltrimethoxysilane, bis(methyldimethoxysilyl)methane, vinyltrimethoxysilane, propylmethyldimethoxysilane, 1,2-bis(methyldimethoxysilyl)ethane, and 1,3,5,7-Tetramethyl-1,3,5,7-tetramethoxycyclotetrasiloxane, among other silicon-carbon-and-oxygen-containing precursors.

In embodiments, the method 300 may further include removing the first substrate containing the dielectric film from the processing chamber 310. Following the removal of the first substrate, at least one additional substrate may be placed in the processing chamber so that the dielectric film may be deposited on the additional substrate at optional operation 320. After each substrate deposition operation, the substrate may be removed from the processing chamber. In some embodiments, at least one additional substrate may be processed through the processing chamber by depositing the dielectric film on the substrate and removing it from the chamber before starting an etch cleaning operation. In additional embodiments, at least two additional substrates may be processed through the processing chamber before starting an etch cleaning operation. In still additional embodiments, at least three additional substrates, at least four additional substrates, at least five additional substrates, at least six additional substrates, or more, may be processed through the processing chamber before starting an etch cleaning operation.

In some embodiments, a treatment operation 315 may be performed after the removal of each processed substrate from the processing chamber. In embodiments, the treatment operation may be optional, and no treatment operation is performed between the placement, processing, and removal of consecutive substrates in the processing chamber. In some embodiments, less than or about twelve particle adders may drop on an additional substrate placed in the processing chamber when no treatment operation is performed after the deposition of a dielectric film on a previously processed and removed substrate.

In additional embodiments, the treatment operation 315 may include introducing non-plasma inert gases through the processing chamber after the removal of a substrate (e.g., the first substrate) and before the introduction of an additional substrate in the processing chamber. The inert gases may create flow conditions inside the processing chamber that facilitate the dislodging an removal of particle adders from dielectric material that was formed on the surfaces of the chamber during the deposition of the dielectric material on the substrate. The removal of these loose particle adders reduces the number of particle adders dropping on a substrate placed in the processing chamber following the treatment operation. In some embodiments, less than or about ten particle adders may drop on an additional substrate placed in the processing chamber after an inert gas treatment operation is performed.

In embodiments, the inert gases may include helium, argon, or nitrogen ($N_2$), among other inert gases. In additional embodiments, the non-plasma inert gases may flow into the processing chamber at a flow rate greater than or about 500 sccm, greater than or about 1000 sccm, greater than or about 2000 sccm, greater than or about 3000 sccm, greater than or about 4000 sccm, greater than or about 5000 sccm, or more. In still additional embodiments, the chamber pressure may be characterized as greater than or about 1 Torr, greater than or about 2 Torr, greater than or about 3 Torr, greater than or about 4 Torr, greater than or about 5 Torr, or more, as the non-plasma inert gases flow into the processing chamber. In yet additional embodiments, a treatment region in the processing chamber that includes the contact of the inert gases with surfaces of the chamber may be characterized by a temperature greater than or about 200° C., greater than or about 250° C., greater than or about 300° C., greater than or about 350° C., greater than or about 400° C., or more, during the treatment operation.

Higher flow rates, chamber pressures, and treatment region temperatures may increase the probability that loose particle adders will dislodge and be removed from the process chamber. However, increasing the flow rate, chamber pressure, and treatment region temperature may also require larger quantities of inert gases and longer temperature ramp up and ramp down times. Thus, the non-plasma inert-gas treatment of the processing chamber may include the balancing of the flow rate, chamber pressure, treatment region temperature, and other treatment parameters, between processing times and materials consumed and the reduction in the number of particle adders dropped on the substrate. In some embodiments, the inert gas treatment operation may be performed in less than or about 10 seconds, less than or about 5 seconds, less than or about 3 seconds, or less.

In still further embodiments, the treatment operation 315 may include introducing a treatment plasma to the processing chamber after the removal of a substrate (e.g., the first substrate) and before the introduction of an additional substrate in the processing chamber. The treatment plasma may create flow conditions inside the processing chamber that facilitate the dislodging an removal of particle adders from dielectric material that was formed on the surfaces of the chamber during the deposition of the dielectric material on the substrate. The removal of these loose particle adders reduces the number of particle adders dropping on a substrate placed in the processing chamber following the treatment operation. In some embodiments, less than or about eight particle adders may drop on an additional substrate placed in the processing chamber after a plasma treatment operation is performed.

In embodiments, the treatment plasma may be formed from treatment plasma precursors including one or more of helium, argon, nitrogen ($N_2$), oxygen ($O_2$), and nitrous oxide ($N_2O$), among other precursors. The treatment plasma precursors may flow into the processing chamber at a flow rate greater than or about 2000 sccm, greater than or about 3000 sccm, greater than or about 4000 sccm, greater than or about 5000 sccm, or more. A treatment plasma may be struck in the processing chamber by delivering a plasma power to the treatment plasma precursors in the chamber. In some embodiments, the treatment plasma power delivered to the plasma precursors in the chamber may be greater than or about 300 Watts, greater than or about 500 Watts, greater than or about 700 Watts, greater than or about 1000 Watts, or more. In additional embodiments, the chamber pressure during the plasma treatment may be characterized as greater than or about 1 Torr, greater than or about 2 Torr, greater than or about 3 Torr, greater than or about 4 Torr, greater than or about 5 Torr, or more. In yet additional embodiments, a treatment plasma region in the processing chamber that includes the contact of the treatment plasma with surfaces of the chamber may be characterized by a temperature greater than or about 200° C., greater than or about 250° C., greater than or about 300° C., greater than or about 350° C., greater than or about 400° C., or more, during the treatment operation. In some embodiments, the treatment plasma operation may be performed in less than or about 30 seconds, less than or about 20 seconds, less than or about 15 seconds, less than or about 10 seconds, less than or about 5 seconds, or less.

In yet further embodiments, the treatment operation 315 may include introducing an additional deposition plasma to the processing chamber after the removal of a substrate (e.g., the first substrate) and before the introduction of an additional substrate in the processing chamber. The additional deposition plasma may create deposition conditions inside the processing chamber that facilitate the adhesion of particle adders from the previously deposited dielectric material on the surfaces of the chamber. The increased adhesion of these particle adders to the surfaces of the processing chamber reduces the number of particle adders dropping on a substrate placed in the processing chamber following the treatment operation. In some embodiments, the number of particle adders that drop on an additional substrate placed in the processing chamber after the deposition treatment may be less than or about five particle adders, less than or about four particle adders, less than or about three particle adders, less than or about two particle adders or less than or about one particle adder.

In embodiments, the deposition plasma may form a silicon oxide film on the surfaces of the processing chamber that include the dielectric material from one or more previous substrate deposition operations. In some embodiments, the deposition plasma may be formed from deposition plasma precursors that may include a silicon-containing precursor and an oxygen-containing precursor. In additional embodiments, the deposition plasma may include a silicon-and-oxygen containing precursor. In embodiments, the silicon-containing precursor may include one or more of silane and disilane, among other silicon-containing precursors and the oxygen containing precursor may include molecular oxygen ($O_2$). In further embodiments, the silicon-and-oxygen-containing precursor may include a silicon-carbon-and-oxygen-containing precursors such as tetraethyl orthosilicate. In still additional embodiments, the silicon-and-oxygen-containing precursor may include one or more silicon-carbon-and-oxygen-containing precursors used to deposit the high-carbon, low-κ, dielectric film on the substrates. In additional embodiments, the deposition plasma may further include one or more carrier gases such as helium, argon, nitrogen, and nitrous oxide, among other carrier gases. In still further embodiments, the silicon-containing precursor may be the same as a silicon-precursor used to form the high-carbon, low-κ, dielectric film on the substrates. In embodiments the as deposited silicon oxide film has less than or about 2 at. % carbon, less than or about 1 at. % carbon, less than or about 0.5 at. % carbon, less than or about 0.1 at. % carbon, or less.

In some embodiments, the treatment operation 315 may include depositing a low-carbon silicon oxide film on the surfaces of the processing chamber by changing the flow of the deposition precursors used to deposit the high-carbon, low-κ, dielectric film on the substrate. In embodiments, the altered deposition plasma is formed from the same silicon-carbon-and-oxygen-containing precursors used to deposit the high-carbon, low-κ, dielectric film on the substrate, but at a lower flow rate relative to an oxygen-containing precursor. In some embodiments, the change in the flow rates of the silicon-carbon-and-oxygen-containing precursors relative to the oxygen-containing precursor may be done without interrupting the flow of the deposition precursors to the processing chamber. In some of these embodiments, a continuous plasma may be maintained between the deposition of the high-carbon, low-κ, dielectric film on the substrate, and the deposition of the low-carbon silicon oxide film on the surfaces of the processing chamber.

In embodiments, the changed flow rates of the deposition precursors may change the oxygen-to-carbon ratio in the deposition plasma to greater than or about 1:1, greater than or about 2:1, greater than or about 3:1, greater than or about 4:1, greater than or about 5:1, or more. As a result, the silicon oxide film deposited by the altered deposition plasma has less carbon than the substrate dielectric film. In some embodiments the as deposited silicon oxide film has less than or about 2 wt. % carbon, less than or about 1 wt. % carbon, less than or about 0.5 wt. % carbon, less than or about 0.1 wt. % carbon, or less.

In embodiments, the deposition plasma precursors may flow into the processing chamber at a flow rate greater than or about 2000 sccm, greater than or about 3000 sccm, greater than or about 4000 sccm, greater than or about 5000 sccm, or more. The deposition plasma may be struck in the processing chamber by delivering a plasma power to the deposition plasma precursors in the chamber. In some embodiments, the treatment plasma power delivered to the plasma precursors in the chamber may be greater than or about 500 Watts, greater than or about 600 Watts, greater than or about 700 Watts, greater than or about 800 Watts, greater than or about 900 Watts, greater than or about 1000 Watts, or more. In additional embodiments, the chamber pressure during the deposition plasma treatment may be characterized as greater than or about 1 Torr, greater than or about 2 Torr, greater than or about 3 Torr, greater than or about 4 Torr, greater than or about 5 Torr, or more. In yet additional embodiments, the deposition plasma region in the processing chamber that includes the contact of the deposition plasma with surfaces of the chamber may be characterized by a temperature greater than or about 200° C., greater than or about 250° C., greater than or about 300° C., greater than or about 350° C., greater than or about 400° C., or more, during the treatment operation. In still further embodiments, the silicon oxide layer formed on the surfaces of the processing chamber may have a thickness less than or about 300 Å, less than or about 200 Å, less than or about 100 Å, less than or about 50 Å, or less. In some embodiments, the deposition plasma operation may be performed in less than or about 30 seconds, less than or about 20 seconds, less than or about 15 seconds, less than or about 10 seconds, less than or about 5 seconds, or less.

Embodiments of method 300 may still further include an etch-cleaning operation 325 after the removal of the last of the at least one additional substrates from the processing chamber. In embodiments, the etch cleaning operation 325 may include flowing etch plasma effluents into the substrate processing chamber after the last substrate is removed. The etch plasma effluents may include plasma effluents from a fluorine-containing precursor and plasma effluents from an oxygen containing precursor. In some embodiments the fluorine-containing precursor may be one or more of nitrogen tri-fluoride ($NF_3$) and fluorine ($F_2$), and the oxygen-containing precursor may be molecular oxygen ($O_2$). In further embodiments, the etch plasma effluents may be formed in a remote plasma system (RPS) located outside the processing chamber and coupled to deliver the plasma effluent to the processing chamber.

In some embodiments, the etch-cleaning operation 325 is operable to etch the buildup of dielectric material from the surfaces of the processing chamber at an increased etch rate. In embodiments, this increased etch rate may be achieved in part by increasing a flow rate of the etch plasma effluents into the processing chamber. Embodiments of the etch-cleaning operation include flowing the fluorine-containing plasma effluent into the processing chamber at a flow rate greater than or about 500 sccm, greater than or about 1000 sccm, greater than or about 1500 sccm, greater than or about 2000 sccm, greater than or about 2500 sccm, greater than or about 3000 sccm, greater than or about 3500 sccm, greater than or about 4000 sccm, greater than or about 4500 sccm, greater than or about 5000 sccm, or more. Embodiments further include flowing the oxygen-containing plasma effluent into the processing chamber at a flow rate greater than or about 1000 sccm, greater than or about 1500 sccm, greater than or about 2000 sccm, greater than or about 2500 sccm, greater than or about 3000 sccm, greater than or about 3500 sccm, greater than or about 4000 sccm, greater than or about 4500 sccm, greater than or about 5000 sccm, greater than or about 5500 sccm, greater than or about 6000 sccm, or more. In some embodiments, the etch plasma effluents may further include one or more carrier gases such as helium or argon, among other carrier gases. The carrier gases may be delivered to the processing chamber at a flow rate greater than or about 500 sccm, greater than or about 1000 sccm, greater than or about 1500 sccm, greater than or about 2000 sccm, greater than or about 2500 sccm, greater than or about 3000 sccm, greater than or about 3500 sccm, greater than or about 4000 sccm, greater than or about 4500 sccm, greater than or about 5000 sccm, or more. In still further embodiments, the etch plasma effluents may flow into the processing chamber at a total flow rate of greater than or about 3000 sccm, greater than or about 4000 sccm, greater than or about 5000 sccm, greater than or about 6000 sccm, greater than or about 7000 sccm, greater than or about 8000 sccm, greater than or about 9000 sccm, greater than or about 10000 sccm, greater than or about 11000 sccm, greater than or about 12000 sccm, or more.

In embodiments of the present technology, the flow rates for the etch plasma effluents may increase an etch rate for the removal of the dielectric materials that have built up on the surfaces of the processing chamber. These built up dielectric materials may include high-carbon, low-κ, dielectric materials characterized by greater than or about 10 at. % carbon. In embodiments, the etch rate for the removal of built-up dielectric materials that include these high-carbon, low-κ, dielectric materials may be characterized as greater than or about 110%, greater than or about 120%, greater than or about 130%, greater than or about 140%, greater than or about 150%, greater than or about 160%, greater than or about 170%, greater than or about 180%, greater than or about 190%, greater than or about 200%, or more, than an etch rate for a conventional etch cleaning operation that has conventional flow rates for etch plasma effluents. These conventional flow rates may be characterized by flow rates of less than or about 1000 sccm for fluorine-containing plasma effluents, and less than or about 3000 sccm for flow oxygen-containing plasma effluents. In further embodiments, the etch-cleaning operation 325 may etch the high-carbon, low-κ, dielectric materials at a faster etch rate that conventional low-κ, dielectric materials having less than or about 15 at. % carbon.

In embodiments, the etch cleaning operation 325 may remove built-up dielectric materials from the surfaces of the processing chamber at an etch rate greater than or about 10 Å/second, greater than or about 12 Å/second, greater than or about 15 Å/second, greater than or about 17 Å/second, greater than or about 20 Å/second, or more. In further embodiments, the etch cleaning operation 325 may remove built up dielectric material from the surfaces of the processing chamber by greater than or about 250 Å, greater than or about 300 Å, greater than or about 350 Å, greater than or about 400 Å, greater than or about 450 Å, greater than or about 500 Å, greater than or about 550 Å, greater than or about 600 Å, or more. In embodiments, the optional treatment operation permits an increased buildup of dielectric materials on the surfaces of the processing chamber without a proportional increase in the number of particle adders dropping on the substrate. The increased thickness of the built-up dielectric materials permits embodiments of the etch cleaning operation to be conducted at higher etch rates to remove an increased thickness of the dielectric materials without the risk of damaging the underlying chamber surfaces.

In further embodiments, the etch cleaning operation 325 include flowing the etch plasma effluents into a processing chamber characterized by a pressure greater than or about 1 Torr, greater than or about 2 Torr, greater than or about 3 Torr, greater than or about 4 Torr, or more. In still further embodiments, the etch-cleaning operation 325 may include an etching region in the processing chamber that is characterized by a temperature of greater than or about 300° C., greater than or about 325° C., greater than or about 350° C., greater than or about 375° C., greater than or about 400° C., greater than or about 425° C., greater than or about 450° C., or more. In embodiments of the etch cleaning operation 325, the etch pressure and temperature in the processing chamber may be controlled to maintain an etch rate for the built-up dielectric materials that is higher than an etch rate for a conventional etch cleaning operation.

Embodiments of the present technology include processing methods that have combinations of etch cleaning operations and treatment operations to increase substrate throughput in processing systems that deposit high-carbon, low-κ dielectric materials on the substrates. Embodiments of processing method 300, for example, may include combinations of an etch cleaning operation 325 and a treatment operation 315 that can process substrates through a processing chamber at a throughput level greater than or about one substrate per minute, greater than or about two substrates per minute, greater than or about three substrates per minute, greater than or about four substrates per minute, greater than or about five substrates per minute, or more. This represents a significant increase in throughput for substrates with deposited high-carbon, low-κ dielectric layers and low counts of particle adders (e.g., less than or about two particle adders). Embodiments of the present technology provides processing methods that achieve these higher substrate throughputs by performing etch cleaning operations with less frequency and in shorter times than conventional etch cleaning methods that have been adapted from chamber cleaning operations for conventional low-κ dielectric materials.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   depositing a dielectric film on a first substrate in a semiconductor processing chamber, wherein the dielectric film comprises a silicon-carbon-oxide;
   removing the first substrate having the dielectric film from the semiconductor processing chamber;
   depositing the dielectric film on at least one more substrate in the semiconductor processing chamber, wherein the at least one more substrate is removed from the semiconductor processing chamber after the dielectric film is deposited on the at least one more substrate; and
   flowing etch plasma effluents into the semiconductor processing chamber after the removal of a last substrate having the dielectric film, wherein the etch plasma effluents comprise greater than or about 500 sccm of $NF_3$ plasma effluents, and greater than or about 1000 sccm of $O_2$ plasma effluents.

2. The semiconductor processing method of claim 1, wherein the method further comprises flowing one or more inert gases through the semiconductor processing chamber after removing the first substrate and before introducing the at least one more substrate to the semiconductor processing chamber.

3. The semiconductor processing method of claim 1, wherein the method further comprises introducing a treatment plasma to the semiconductor processing chamber after removing the first substrate and before introducing the at least one more substrate to the semiconductor processing chamber.

4. The semiconductor processing method of claim 1, wherein the method further comprises introducing a deposition plasma to the semiconductor processing chamber after removing the first substrate and before introducing the at least one more substrate to the semiconductor processing chamber, wherein the deposition plasma forms a silicon oxide film on surfaces of the semiconductor processing chamber exposed to the deposition plasma.

5. The semiconductor processing method of claim 1, wherein the silicon-carbon-oxide dielectric film comprises greater than or about 10 wt. % carbon.

6. The semiconductor processing method of claim 1, wherein the etch plasma effluents remove the dielectric film from surfaces of the semiconductor processing chamber at a removal rate greater than or about 10 Å/second.

7. The semiconductor processing method of claim 1, wherein the etch plasma effluents remove a buildup of the dielectric film on surfaces of the semiconductor processing chamber by greater than or about 250 Å.

8. The semiconductor processing method of claim 1, wherein the plasma etch effluents are formed from an etch plasma generated in a remote plasma system outside the semiconductor processing chamber.

9. A semiconductor processing method comprising:
   depositing a dielectric film on at least one substrate in a semiconductor processing chamber, wherein the dielectric film comprises a silicon-carbon-oxide;
   introducing a deposition plasma to the semiconductor processing chamber after removal of the substrate from the semiconductor processing chamber, wherein the deposition plasma forms one or more silicon oxide films on surfaces of the semiconductor processing chamber exposed to the deposition plasma; and
   etching a dielectric material and a silicon oxide material from the surfaces of the semiconductor processing chamber at an etch rate greater than or about 10 Å/second.

10. The semiconductor processing method of claim 9, wherein the deposition plasma that forms the one or more silicon oxide films is generated from a silicon-containing precursor that is also used to deposit the dielectric film on the at least one substrate.

11. The semiconductor processing method of claim 9, wherein each of the one or more silicon oxide films formed on the surfaces of the semiconductor processing chamber has a thickness less than or about 100 Å.

12. The semiconductor processing method of claim 9, wherein the dielectric film is deposited on at least two substrates in the semiconductor processing chamber before etching the dielectric material and the silicon oxide material from the surfaces of the semiconductor processing chamber.

13. The semiconductor processing method of claim 9, wherein the dielectric material and the silicon oxide material are etched from the surfaces of the semiconductor processing chamber by a thickness of greater than or about 250 Å.

14. The semiconductor processing method of claim 9, wherein the etching of the dielectric material and the silicon oxide material comprises flowing etch plasma effluents into the semiconductor processing chamber, and wherein the etch plasma effluents comprise a fluorine-containing effluent and an oxygen-containing effluent, and further wherein a flow rate of the etch plasma effluents into the semiconductor processing chamber at greater than or about 2000 sccm.

15. A semiconductor processing method comprising:
   cycling at least two substrates through a semiconductor processing chamber, wherein a dielectric film comprising silicon-carbon-oxide is deposited on each of the substrates in the semiconductor processing chamber; and
   flowing etchants into the semiconductor processing chamber after a removal of a last substrate of the at least two substrates, wherein the etchants comprise $NF_3$ and $O_2$, wherein the $NF_3$ flows into the semiconductor processing chamber at greater than or about 2000 sccm, and wherein the semiconductor processing chamber is characterized by a pressure greater than or about 1 Torr during the flow of the etchants into the semiconductor processing chamber.

16. The semiconductor processing method of claim 15, wherein the etchants comprise plasma effluents of $NF_3$ and $O_2$ generated in a remote plasma system.

17. The semiconductor processing method of claim 15, wherein the etchants further include a carrier gas comprising at least one of helium or argon, and wherein the carrier gas flows into the semiconductor processing chamber at carrier gas flow rate greater than or about 500 sccm.

18. The semiconductor processing method of claim 15, wherein the semiconductor processing chamber is characterized by a temperature greater than or about 300° C. flowing the etchants into the semiconductor processing chamber.

19. The semiconductor processing method of claim 15, wherein the method further comprises treating the semiconductor processing chamber after the removal of each of the at least two substrates from the semiconductor processing chamber following depositing the dielectric film on each of the at least two substrates, wherein the treating is selected from the group consisting of:

(i) flowing one or more inert gases through the semiconductor processing chamber after the removal of each of the at least two substrates from the semiconductor processing chamber, (ii) introducing a treatment plasma to the semiconductor processing chamber after the removal of each of the at least two substrates from the semiconductor processing chamber, and (iii) introducing a deposition plasma to the semiconductor processing chamber after the removal of each of the at least two substrates from the semiconductor processing chamber, wherein the deposition plasma forms a silicon oxide film on surfaces of the semiconductor processing chamber exposed to the deposition plasma.

20. The semiconductor processing method of claim 15, wherein the silicon-carbon-oxide dielectric film comprises greater than or about 10 at. % carbon.

* * * * *